United States Patent
Koifman et al.

(10) Patent No.: US 6,232,903 B1
(45) Date of Patent: May 15, 2001

(54) SEQUENCING SCHEME FOR REDUCING LOW FREQUENCY TONE GENERATION IN AN ANALOGUE OUTPUT SIGNAL

(75) Inventors: Vladimir Koifman, Rama Gan; Yachin Afek, Kfar Saba; Sergio Liberman, Natania, all of (IL)

(73) Assignee: Motorola, Inc., Schaumburg, IL (US)

( * ) Notice: Subject to any disclaimer, the term of this patent is extended or adjusted under 35 U.S.C. 154(b) by 633 days.

(21) Appl. No.: 08/568,718

(22) Filed: Dec. 7, 1995

(30) Foreign Application Priority Data

Dec. 22, 1994 (GB) .................................................. 9426471

(51) Int. Cl.⁷ ...................................................... H03M 1/66
(52) U.S. Cl. .............................................................. 341/144
(58) Field of Search .................................... 341/144, 118, 341/120, 150

(56) References Cited

U.S. PATENT DOCUMENTS

| | | | |
|---|---|---|---|
| 3,982,172 | * 9/1976 | Van De Plassche | 323/1 |
| 4,125,803 | * 11/1978 | Van De Plassche | 323/1 |
| 5,084,701 | 1/1992 | Sauerwald | 341/118 |
| 5,221,926 | * 6/1993 | Jackson | 341/118 |
| 5,293,166 | * 3/1994 | Ta | 341/118 |
| 5,305,004 | * 4/1994 | Fattaruso | 341/120 |
| 5,508,702 | * 4/1996 | Estrada et al. | 341/136 |

FOREIGN PATENT DOCUMENTS 2080059A 7/1981 (GB) .............................. H03K/13/02

* cited by examiner

*Primary Examiner*—Brian Young

(57) ABSTRACT

A noise cancellation circuit for use with a digital signal includes a plurality of equally weighted cells (53) for providing an analogue output signal (35) in dependence upon the value of the digital signal. A switching arrangement (51) dynamically switches a number of the plurality of cells according to a sequencing scheme, which comprises a first sequence arranged to switch each of the plurality of cells (53) an equal number of times, and a second sequence arranged to define one of the plurality of cells (53) as a starting position for the first sequence. In this way low frequency tone generation within the analogue output signal is substantially eliminated.

11 Claims, 2 Drawing Sheets

SEQUENCING SCHEME FOR REDUCING LOW FREQUENCY TONE GENERATION IN AN ANALOGUE OUTPUT SIGNAL

FIELD OF THE INVENTION

This invention relates to noise cancellation circuits and particularly but not exclusively to noise cancellation circuits for use with D/A and A/D converters.

BACKGROUND OF THE INVENTION

In an oversampled digital to analogue (D/A) converter, such as a sigma-delta modulator, a digital input signal is to be converted to an analogue output signal. The input signal is first interpolated to produce an oversampled signal, which is modulated by a digital modulator to generate an N-bit signal. The N-bit signal has a low-frequency component resembling the input signal and a high-frequency "quantization noise", which is typically removed with a low pass filter.

For an N-bit D/A converter there must be at least one (N=1) dynamic analogue element, such as a current source, which is used to generate the analogue signal. Each additional element used gives an increase in signal to noise ratio (SNR) of 6 dB, so it is desirable to have a large N if possible.

However, a problem with this arrangement is that each analogue element will be slightly mismatched with respect to the others, and the oversampling gives rise to harmonic distortion if the elements, which are arranged in an array, are always used in the same order.

Methods of dynamic element matching are known, which seek to disrupt the order of using the elements by selecting a new starting position in the array, based on the last used element (such that the elements are used substantially equally). However, for some signal levels, the above matching method gives rise to a pattern of element usage that produces low frequency tone.

This invention seeks to provide a noise cancellation circuit which mitigates the above mentioned disadvantages.

SUMMARY OF THE INVENTION

According to a first aspect of the present invention there is provided a noise cancellation circuit for use with a digital signal, comprising: a plurality of equally weighted cells for receiving the digital signal and for providing an analogue output signal in dependence upon the value of the received digital signal; and switching means for dynamically switching a number of the plurality of cells according to a sequencing scheme, wherein the sequencing scheme comprises a first sequence arranged to switch each of the plurality of cells an equal number of times, and a second sequence arranged to define one of the plurality of cells as a starting position for the first sequence, such that low frequency tone generation within the analogue output signal is substantially eliminated.

Preferably the switching means is a decoder having a plurality of output lines, such that each line is coupled to switch one of the plurality of cells. The switching means preferably includes a random number generator, arranged to provide a random number, such that the starting position for the first sequence is defined randomly at each occurrence of the second sequence.

Preferably the plurality of cells is an array of switchable current sources. Alternatively, the plurality of cells is preferably an array of switchable capacitors.

According to a second aspect of the present invention there is provided a noise cancellation method, comprising the steps of: receiving a digital signal; modulating the digital signal with a delayed digital signal to provide a modulated signal; quantizing the modulated signal for providing a quantized signal, and dynamically switching a number of cells in dependence upon the value of the quantized signal, to provide an analogue output signal, the switching being performed according to a sequencing scheme, wherein the sequencing scheme comprises a first sequence arranged to switch each of the plurality of cells an equal number of times, and a second sequence arranged to define one of the plurality of cells as a starting position for the first sequence, such that low frequency tone generation within the analogue output signal is substantially eliminated.

Preferably the second sequence includes a random step, such that the starting position for the first sequence is defined randomly at each occurrence of the second sequence. A random number is preferably generated at each occurrence of the second sequence, to provide a value for the random step.

Preferably the first sequence includes an incremental step, each of the plurality of cells being used once per occurrence of the first sequence. The first and second sequences are preferably used alternately by the sequencing scheme.

In this way the use of the cells is managed such that harmonic distortion caused by mismatching of the elements is reduced.

BRIEF DESCRIPTION OF THE DRAWINGS

An exemplary embodiment of the invention will now be described with reference to the drawings in which.

DETAILED DESCRIPTION OF A PREFERRED EMBODIMENT

Figure 1:
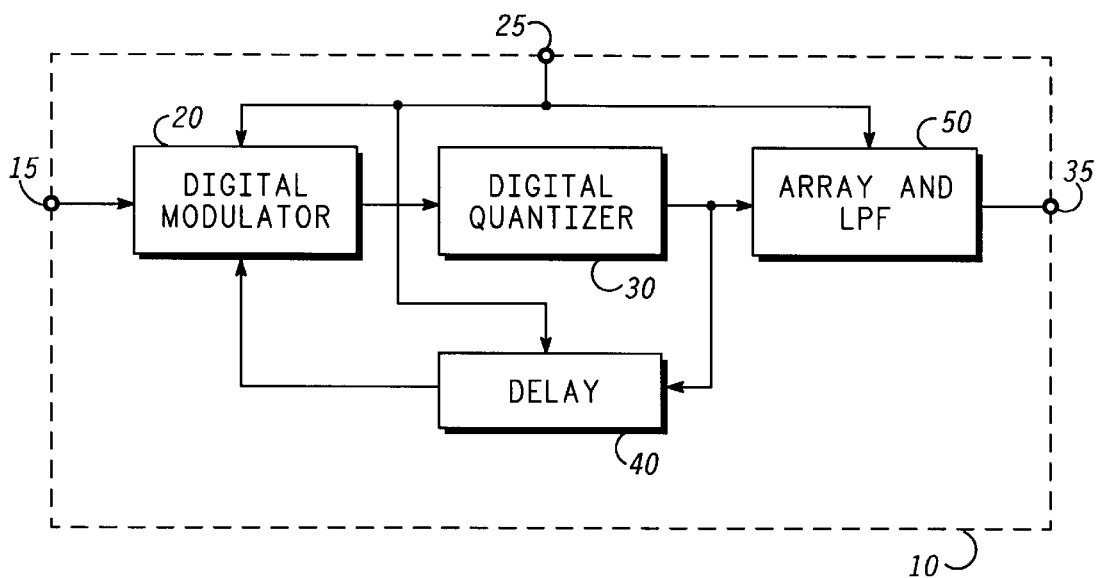
FIG. 1 shows a preferred embodiment of a noise cancellation circuit in accordance with the invention.

Referring to FIG. 1, there is shown an oversampled digital to analogue converter (DAC) 10, comprising a digital modulator 20, a digital quantizer 30 a delay element 40 and an analogue array and low pass filter (LPF) circuit 50.

The digital modulator 20 is coupled to receive a digital input signal from an input terminal 15, a feedback input to be further described below and a data output for providing modulated data signals. The digital input signal comprises N1 data bits. The digital modulator 20 is any noise shaping modulator, for example a modulator such as that described by James C. Candy et al in IEEE Trans. Commun., Vol. COM-34. pp.77–81, January 1986.

A clock control input 25 of the circuit 10, is coupled to provide periodic clocking signals to control the timing of the digital modulator 20, the delay element 40 and the analogue array and LPF circuit 50.

The digital quantizer 30 has a data input coupled to receive the modulated data signals from the data output of the digital modulator 20 and a data output for providing quantized data signals. The digital quantizer 30 is an N1 to N2 bit quantizer which accepts an N1 bit data input (the modulated data signals) and truncates it into an N2 (N2<N1) output (the quantized data signals). The output range is from 0 to Nmax.

The delay element 40 has a data input coupled to receive the quantized data signals from the data output of the digital quantizer 30 and a data output for providing delayed data signals. The delay element 40 is arranged to store an instantaneous value of the quantized data and output an existing stored value at each occurrence of the periodic clocking signal. The data output of the delay element 40 is coupled to the feedback input of the digital modulator 20, such that the delayed output signals are fed back to the digital modulator 20.

Figure 2:
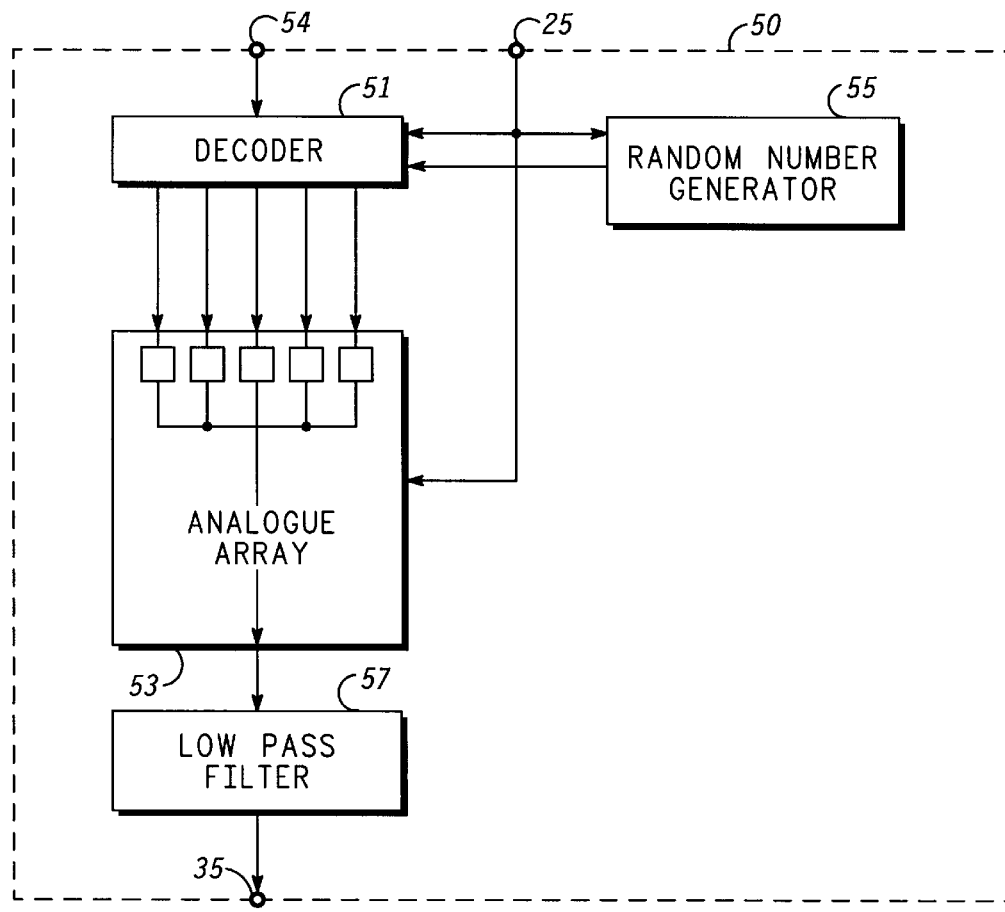
FIG. 2 illustrates an analogue array and low pass filter circuit in accordance with the present invention.

As more clearly shown in FIG. 2, the analogue array and LPF circuit 50 has a data input 54 coupled to receive the quantized data signals from the data output of the digital quantizer 30 and an analogue output for providing analogue signals to the output terminal 35.

A decoder 51 of the circuit 50 is coupled to receive the quantized data signals from the data input 54 and the periodic clocking control signals from the clock control input 25. A (pseudo) random number generator unit 55, coupled to receive the periodic clocking signal, is also coupled to provide a N2 bit random number to the decoder 51, at each occurrence of the periodic clocking signal. The random output range is from 0 to Rmax, where Rmax+Nmax=L. The decoder 51 has a data output, comprising L data lines, each data line for providing one data bit.

An analogue array 53 is coupled to receive the L data bits from the data output of the decoder 51. The analogue array 53 comprises a series of L analogue elements each having a data input coupled to one of the data lines for receiving one data bit. The analogue elements have a common output. The L elements are switchable current sources, arranged to be switched in dependence upon their inputs. In this way the common output provides a summed analogue output signal proportional to the number of L data bits received by the array 53 from the data output of the decoder 51.

A low pass filter 57 has an analogue input coupled to the receive the analogue signals from the analogue output of the array 53, and an analogue output for providing filtered analogue signals to the output terminal 35. The low pass filter 57 provides an analogue smoothing function.

Figure 3:
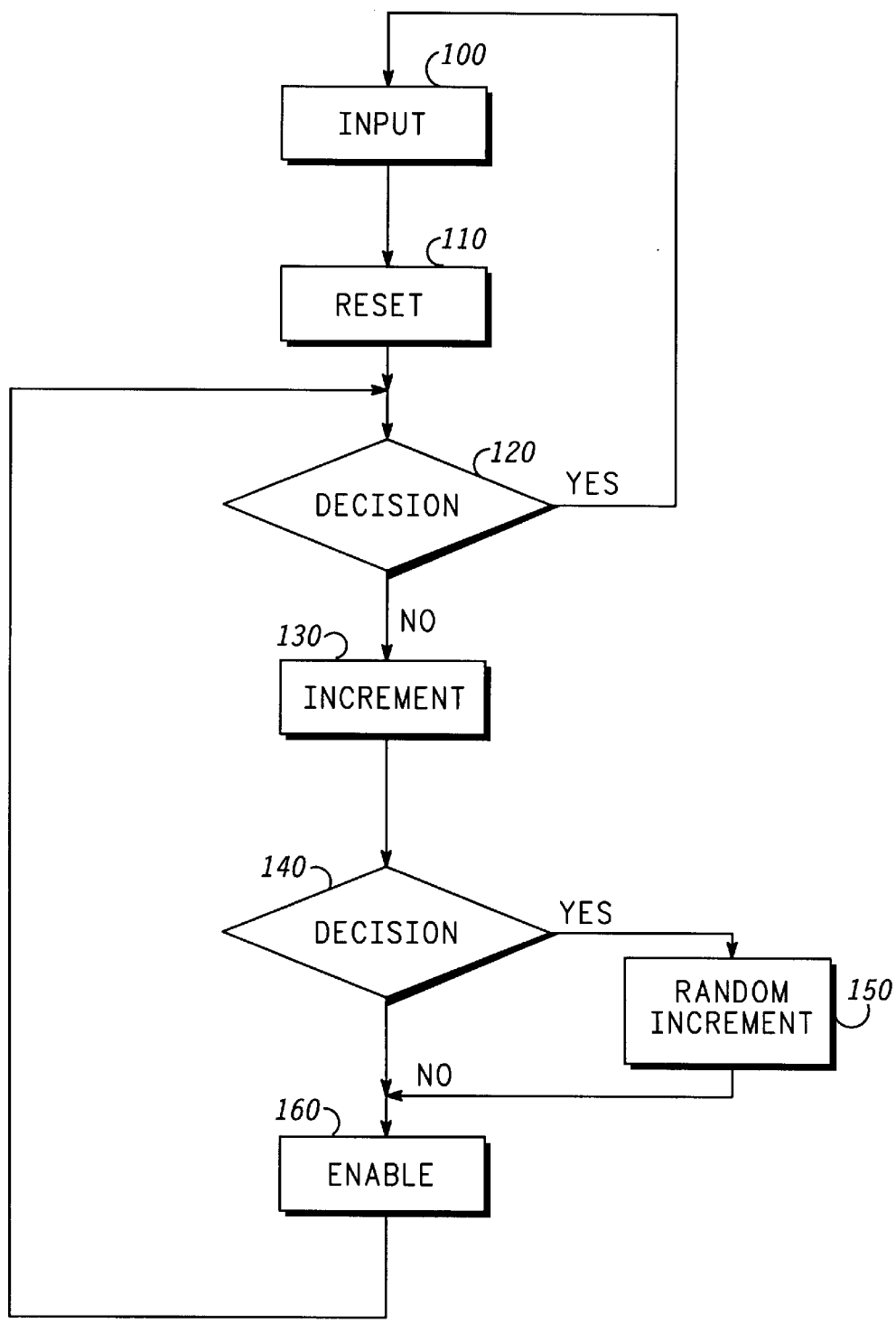
FIG. 3 is a functional flow diagram of the preferred embodiment of FIG. 1.

Referring now also to FIG. 3, a sequencing scheme which defines the function of the decoder 51 starts with an input 100, comprising a data input N, which is the quantized data input to the decoder 51, and random input R, which is a random number generated by the random number generator 55.

A counter K is then set to 0 and the outputs of the L elements are also reset to 0 (110). The values of K and N are compared to each other 120, sending the algorithm flow back to the input 100 if K has reached the value of N.

Otherwise, an element pointer CP, which is an address pointer arranged to point to one of the elements of the array 53, is incremented by one, 130, so as to point to the next element in the array 53. When the element pointer CP is pointing to the last element (L'th element) of the array 53, the increment wraps around to the first element of the array 53. The algorithm thus performs the function CP=(CP+1) modulo L, in increment block 130. Hence when CP=L, the next incremental step will result in CP=0.

A starting point variable SP, which is another address pointer, to be further described below, is then compared with the element pointer CP, 140. If the two variables CP and SP are not equal, the K integer is incremented by one (K=K+1) and the element pointed to by the CP variable is enabled (set to 1), 160.

However, if CP=SP, a random increment is performed, 150, wherein the variable CP is incremented by a random number, generated by the random number generator 55, (CP=(CP+R) modulo L). The value of SP is then set to the new value of CP (SP=CP), such that SP is defined as the element being pointed to immediately following the random increment. The K integer is then incremented by one (K=K+1) and the element pointed to by the CP variable is enabled (set to 1), 160.

Then the values of K and N are compared to each other again 120, sending the algorithm flow back to the input 100 if K has reached the value of N, and continuing as above if not.

Mismatch between the L analogue element in the analogue array is inherent in the production process of microelectronic components. A sequential order of enabling the array elements (as performed in a decoder according to the prior art) combined with the element mismatch results in tones and harmonic distortion at the analogue output 35. These effects are related to "limited cycles" in the enablement of the array elements for various data input values. Alternatively, a wholly random order of enabling the array elements results in an increased analogue output noise.

In operation, the digital input signal received at the input terminal 15 is clocked into the data modulator 20 along with the delayed output signal at each occurrence of the periodic clocking signal. The digital quantizer 30 receives the modulated data signals from the data modulator 20, and provides the quantized data signals to the delay element 40 and to the analogue array and LPF circuit 50.

The decoder 51 of the circuit 50 receives the quantized data signal and the periodic clocking control signal. A (pseudo) random number generator unit 55 provides a N2 bit random number to the decoder 51, at each occurrence of the periodic clocking signal. The decoder 51 sends the L data bits to the array 53 according to the following sequencing scheme.

The decoder 51 commences a first sequence by selecting a current element of the array 53 with the current pointer CP. The counter K is set to zero, 110 and is used to count up to N, the value of the quantized data signal clocked into the decoder 51. K is compared with N, 120, and if K has reached the value of N, then the correct number of array elements have been enabled, and the decoder waits until the next quantized data signal is clocked in, 100. If K is less than N, the decoder 51 increments the current pointer CP by one, 130, and then compares it with the start pointer SP.

If the value of CP has not reached that of SP, then the decoder continues the first sequence by enabling the element being pointed to by CP and incrementing K, 160. If the value of CP has reached that of SP, then the decoder 51 performs a second sequence, which is a jump (random increment) in the value of CP by R, the random number. The decoder 51 then sets SP to that value, 150, which is the new starting position for the first sequence. This completes the second sequence. The decoder 51 then proceeds to the enable block 160, where a new first sequence is commenced, at the new starting position defined by SP. Thus the first and the second sequences are used alternately.

The decoder 51 then compares K with N again, 120, and thus repeats the above cycle. In this way each element of the array is used substantially equally in the first sequence, the operation of the current pointer CP and start pointer SP ensuring that each element is enabled once per first sequence, thus reducing noise.

Furthermore, due to the random nature of the second sequence which defines the starting position of the first sequence, there are no finite cycle oscillations and hence substantially no tones or harmonic distortion.

It will be appreciated by a person skilled in the art that alternate embodiments to the one described above. For example, the analogue array could alternately be composed of an array of switchable capacitors.

What is claimed is:

1. A noise cancellation circuit for use with a digital signal, comprising:

a plurality of equally weighted cells for receiving the digital signal and for providing an analogue output signal in dependence upon the value of the received digital signal; and switching means for dynamically switching a number of the plurality of cells according to a sequencing scheme, wherein the sequencing scheme comprises a first sequence arranged to switch each of the plurality of cells in a sequential order an equal number of times, and a second sequence arranged to randomly define, using a random number generator, one of the plurality of cells as a starting position for the first sequence, such that low frequency tone generation within the analogue output signal is substantially eliminated.

2. The circuit of claim 1 wherein the switching means is a decoder having a plurality of output lines, such that each line is coupled to switch one of the plurality of cells.

3. The circuit of claim 1 wherein the switching means includes a random number generator, arranged to provide a random number, such that the starting position for the first sequence is defined randomly at each occurrence of the second sequence.

4. The circuit of claim 1 wherein the plurality of cells is an array of switchable current sources.

5. The circuit of claim 1 wherein the plurality of cells is an array of switchable capacitors.

6. A noise cancellation method, comprising the steps of:

receiving a digital signal; modulating the digital signal with a delayed digital signal to provide a modulated signal; quantizing the modulated signal for providing a quantized signal, and dynamically switching a number of cells in dependence upon the value of the quantized signal, to provide an analogue output signal, the switching being performed according to a sequencing scheme, wherein the sequencing scheme comprises a first sequence arranged to switch each of the plurality of cells an equal number of times, wherein the first sequence switches each of the plurality of cells incrementally, and a second sequence is arranged to randomly define, using a random number generator, one of the plurality of cells as a starting position for the first sequence, such that low frequency tone generation within the analogue output signal is substantially eliminated.

7. The method of claim 6 wherein the second sequence includes a random step, such that the starting position for the first sequence is defined randomly at each occurrence of the second sequence.

8. The method of claim 7 wherein a random number is generated at each occurrence of the second sequence, to provide a value for the random step.

9. The circuit of claim 1 wherein the first sequence includes an incremental step, each of the plurality of cells being used once per occurrence of the first sequence.

10. The circuit of claim 1 wherein the first and second sequences are used alternately by the sequencing scheme.

11. The method of claim 6 wherein the first and second sequences are used alternately by the sequencing scheme.

* * * * *